United States Patent
Yih et al.

(10) Patent No.: US 7,005,696 B2
(45) Date of Patent: Feb. 28, 2006

(54) STRUCTURE OF NONVOLATILE MEMORY ARRAY

(75) Inventors: Cheng-Ming Yih, Hsin-Chu (TW); Huei-Huarng Chen, Chang-Hua (TW); Hsuan-Ling Kao, Taipei (TW)

(73) Assignee: Macronix International Co., Ltd., (TW)

( * ) Notice: Subject to any disclaimer, the term of this patent is extended or adjusted under 35 U.S.C. 154(b) by 3 days.

(21) Appl. No.: 10/644,902

(22) Filed: Aug. 21, 2003

(65) Prior Publication Data

US 2005/0040467 A1  Feb. 24, 2005

(51) Int. Cl.
*H01L 29/76* (2006.01)
(52) U.S. Cl. ............... 257/314; 257/315; 257/324
(58) Field of Classification Search .......... 257/314, 257/315, 324, E21.68
See application file for complete search history.

(56) References Cited

U.S. PATENT DOCUMENTS

| 6,153,471 | A  | * | 11/2000 | Lee et al. ............ 438/263 |
| 6,211,012 | B1 | * | 4/2001  | Lee et al. ............ 438/257 |
| 6,372,564 | B1 | * | 4/2002  | Lee .................... 438/192 |
| 6,635,532 | B1 | * | 10/2003 | Song et al. .......... 438/259 |

* cited by examiner

*Primary Examiner*—Tu-Tu Ho

(57) ABSTRACT

A structure of a nonvolatile memory array with low source line sheet resistance is disclosed in this present invention. The key aspect of this present invention is employing a buried conductive region as the source line of a nonvolatile memory array. The topology of the above-mentioned buried conductive region is different from the source line in the prior art. Therefore, this invention can provide a nonvolatile memory array for reducing the source line sheet resistance and achieving the reliability and the operating performance of the nonvolatile memory array.

4 Claims, 4 Drawing Sheets

STRUCTURE OF NONVOLATILE MEMORY ARRAY

BACKGROUND OF THE INVENTION

1. Field of the Invention

This present invention relates to a structure of nonvolatile memory, and more particularly to a structure of nonvolatile memory with low source line sheet resistance.

2. Description of the Prior Art

Nonvolatile memory array is a well-known and useful structure in an integrated circuit. It is always one of the study objects to improve the reliability and the operating performance of a nonvolatile memory array.

FIG. 1A is a top view of a structure of a nonvolatile memory array in the prior art. Referred to FIG. 1A, the nonvolatile memory array comprises a plurality of shallow trench isolation 110, a plurality of second polysilicon layer 120, and a plurality of contact 130. The second polysilicon layer 120 may be the word line of the above-mentioned nonvolatile memory array. The above-mentioned nonvolatile memory array further comprises a source line. The source line is disposed in the A–A' direction in FIG. 1A.

FIG. 1B is a cross-section (A–A') view of FIG. 1A. According to FIG. 1B, a plurality of shallow trench isolation 110 is disposed in the substrate 100. A source line 140 is formed on the surface of the substrate 100 and under the shallow trench isolation 110. From FIG. 1B, it can be found that portions of the source line 140 are recessed by the shallow trench isolation 110, and thus the topology of the high-step (the source line on the surface of the substrate) and the low-step (the source line under the shallow trench isolation) profile is formed in the source line 140. The source line sheet resistance will be raised by the recess of the source line.

FIG. 1C is a cross-section (B–B') view of FIG. 1A. As shown in FIG. 1C, besides the shallow trench isolation 110 and the source line 140, the nonvolatile memory array further comprises a plurality of drain regions 150 in the substrate 100. The nonvolatile memory array further comprises a plurality of first polysilicon layer 160 on the substrate 100, and a plurality of second polysilicon layer 120 on the first polysilicon layers, respectively. The first polysilicon layer 160 and the second polysilicon layer 120 can construct the gate structure of the above-mentioned nonvolatile memory array.

FIG. 1D is a cross-section (C–C') view of FIG. 1A. As shown in FIG. 1D, because of the shallow trench isolation 110 disposed in the source line 140, the recess of the source line 140 is occurred. While the above-mentioned nonvolatile memory array is operated, the recess of the source line 140 will raise the source line sheet resistance, and thus the reliability and the operating performance of the nonvolatile memory array will be decreased.

Hence, it is an important object of developing a structure of nonvolatile memory array with low source line sheet resistance. Moreover, the above-mentioned nonvolatile memory array can increase the reliability and the operating performance of the nonvolatile memory array.

SUMMARY OF THE INVENTION

In accordance with the present invention, a nonvolatile memory array is provided, wherein the nonvolatile memory array comprises a buried source line with different topology from the source line in the prior art, and thus the source line sheet resistance of the nonvolatile memory array is reduced.

It is another object of this invention to provide a structure of a nonvolatile memory array. The reliability and operating performance of the nonvolatile memory array can be raised by improving the topology of the source line of the nonvolatile memory array.

It is still another object of this present invention to provide a structure of a nonvolatile memory array. The source line sheet resistance of the nonvolatile memory array can be reduced by reducing the recess of the buried conductive region in the isolation region of the nonvolatile memory array.

It is still another object of this present invention to provide a structure of a nonvolatile memory array. The recess of the source line in the isolation region of the nonvolatile memory array is reduced by providing a nonvolatile memory array with no isolation region in the buried conductive region.

In accordance with the above-mentioned objects, this invention provides a structure of a nonvolatile memory array with low source line sheet resistance. The above-mentioned nonvolatile memory array comprises a substrate, a plurality of isolation region in the substrate, at least a buried conductive region between the isolation regions, and a plurality of gate structure on the substrate. The isolation region may be shallow trench isolation. The buried conductive region may be the source line of the nonvolatile memory array. Because no isolation region is disposed in the buried conductive region, the manufacturing process of the above-mentioned nonvolatile memory array is simpler than the process of the nonvolatile memory array in the prior art. Moreover, due to the above-mentioned structure without isolation region in the buried conductive region, the source line sheet resistance of the above-mentioned nonvolatile memory array is lower than the source line sheet resistance of the nonvolatile memory array in the prior art. Therefore, the reliability and the operating performance of the nonvolatile memory array according to this invention can be improved.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Figure 1A:
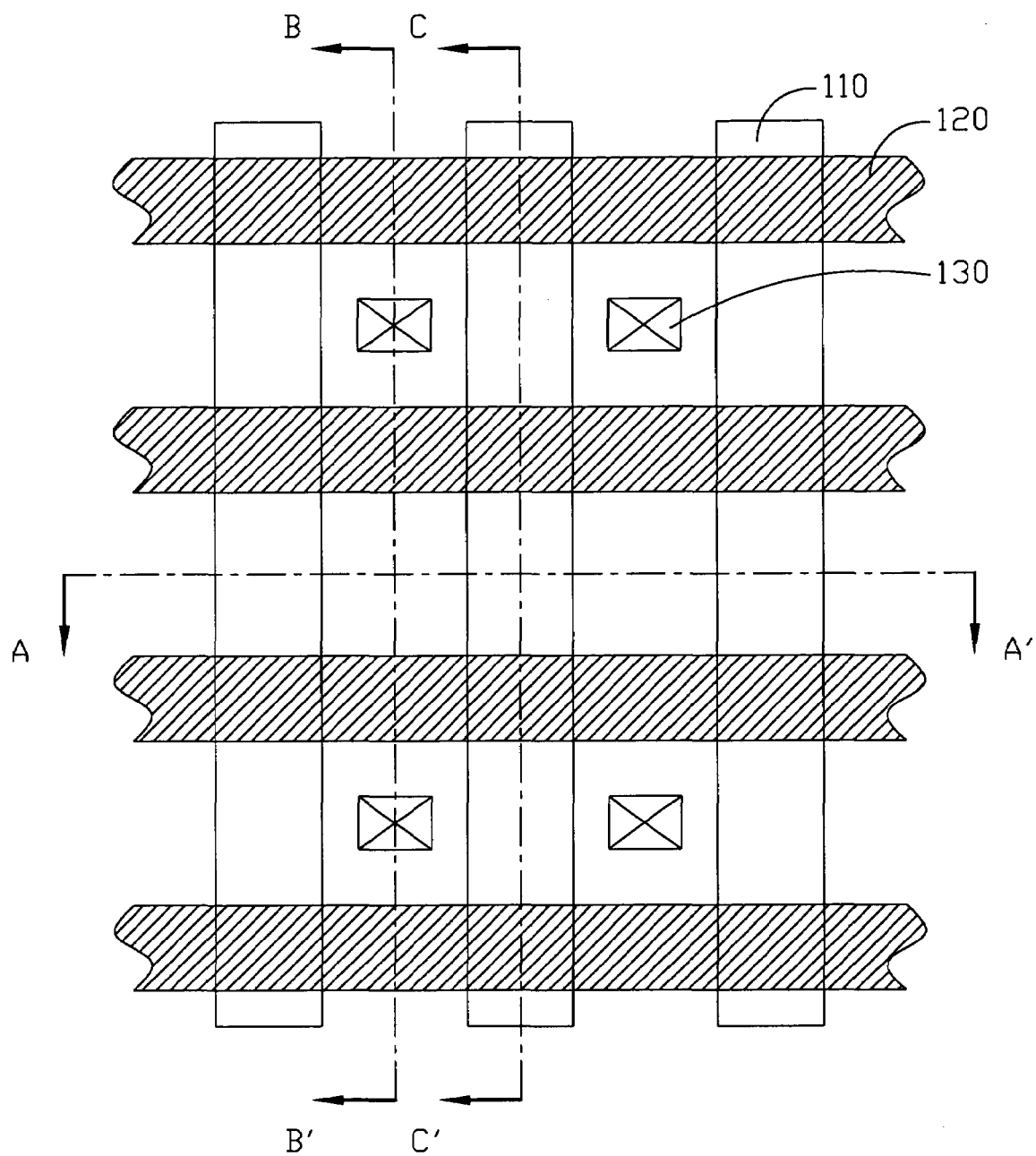
FIG. 1A is a top view of a nonvolatile memory array according to the prior art.

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Then, the components of the semiconductor devices are not shown to scale. Some dimensions are exaggerated to the related components to provide a more clear description and comprehension of the present invention.

One preferred embodiment of this invention is a structure of a nonvolatile memory array. The nonvolatile memory array comprises a substrate, and a buried conductive region. The nonvolatile memory array further comprises a plurality of isolation region in the substrate. The isolation region may be shallow trench isolation (STI). The above-mentioned buried conductive region may be a buried source line. The buried conductive region is between the isolation regions, and perpendicular to the isolation regions. The buried conductive region is on the surface of the substrate, such that the buried conductive region is not under the isolation regions.

The nonvolatile memory array further comprises a plurality of gate structure on the substrate. Each of the gate structure comprises a first polysilicon layer on the substrate, and a second polysilicon layer on the first polysilicon layer. The second polysilicon layer may be the word line of the above-mentioned nonvolatile memory array. The nonvolatile memory array further comprises a plurality of contact as the connection between the nonvolatile memory array and other semiconductor device.

The buried source region may be formed by ion implantation, or other technology. The buried source region may be a line parallel to the second polysilicon layers. The difference between the source regions according to this embodiment and the prior art is, portions of the source region in the prior art are under the isolation regions, but there is no isolation region formed above the buried conductive region of the source line according to this embodiment. As the mentioned above, because the isolation region is formed in the source region in the prior art, the topology of the source line in the prior art will comprise the high-step or low-step profiles. The source line sheet resistance will be raised by the high-step or low-step profile, and the reliability of the nonvolatile memory array will be decreased thereof.

However, in this embodiment, there is no isolation region formed in the source region. The above-mentioned high-step or low-step profile in the prior art, and the issue due to the above-mentioned topology, will not occurred in the source region according to this embodiment. For instance, the buried source region according to this embodiment may be a flat one, disposed on the surface of the substrate. The depth of the buried source region, from the highest level of the buried source region to the lowest level of the buried source region, is less than the depth of the isolation region, such as shallow trench isolation. Accordingly, the source line sheet resistance of the above-mentioned buried conductive region is lower than the source line sheet resistance of the source region in the prior art. In other words, the reliability of the nonvolatile memory array according to this embodiment is higher than the reliability of the nonvolatile memory array in the prior art.

Figure 2A:
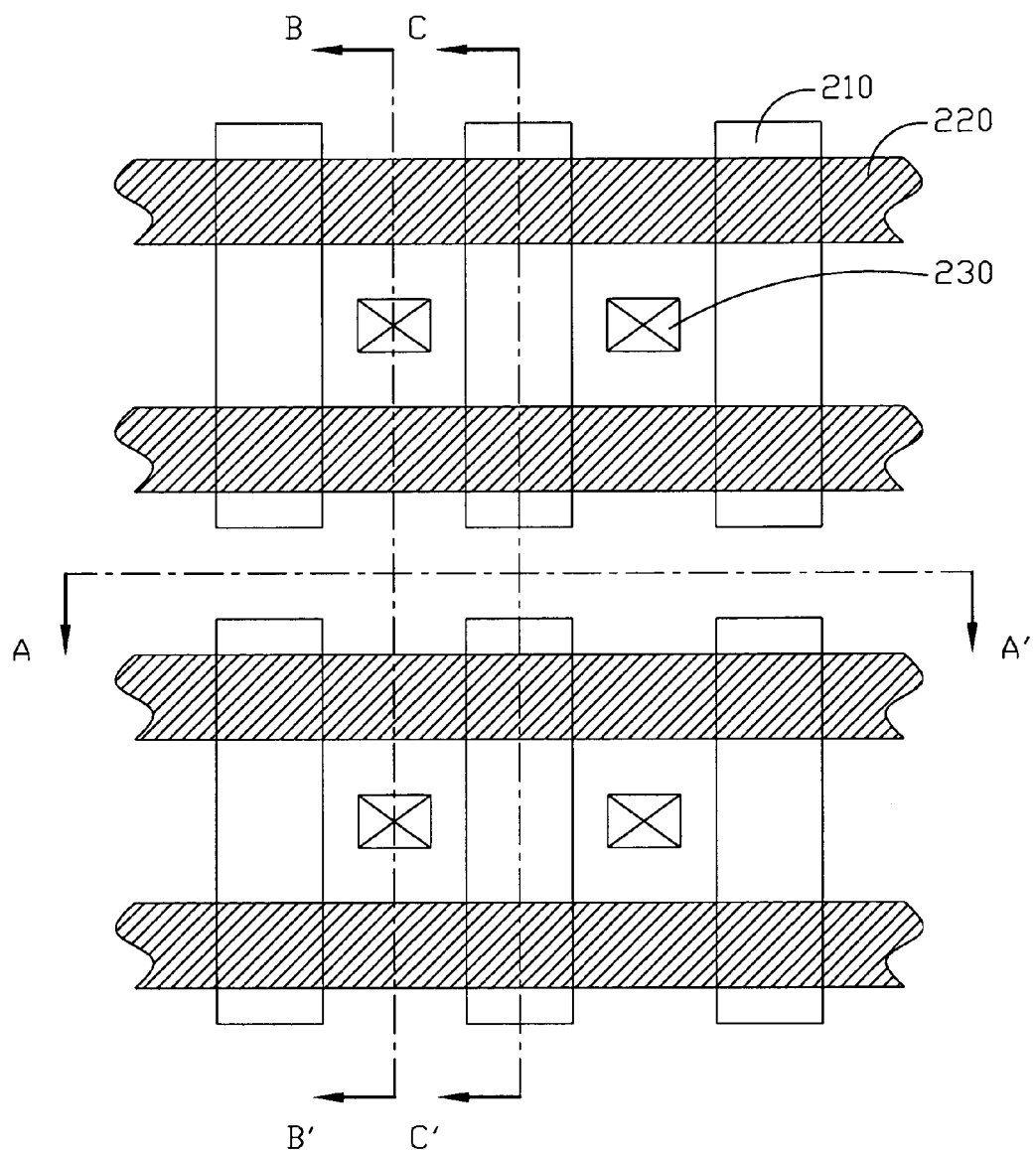
FIG. 2A is a top view of a nonvolatile memory array according to this present invention.

Another preferred embodiment of this present invention is about a structure of a nonvolatile memory array with low source line sheet resistance. FIG. 2A is a top view of a nonvolatile memory array according to this embodiment. Referred to FIG. 2A, the nonvolatile memory array comprises a plurality of isolation region 210 in a substrate, and a plurality of gate structure on the substrate. The isolation region 210 may be shallow trench isolation. The gate structure at least comprises a first polysilicon layer, not shown in FIG. 2A, and a second polysilicon layer 220. The second polysilicon layer 220 may be the word line of the nonvolatile memory array. The nonvolatile memory array further comprises a plurality of contact 230.

Figure 2B:
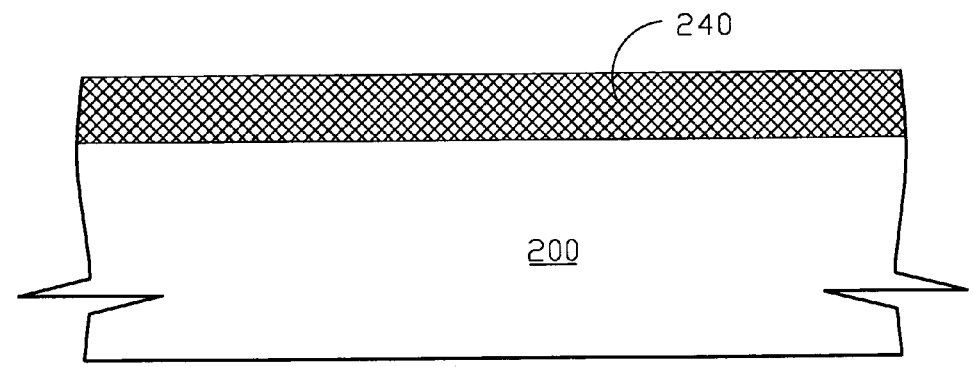
FIG. 2B is a cross section view along the line A–A' in FIG. 2A.

The nonvolatile memory array further comprises at least a buried conductive region disposed along the A–A' line in FIG. 2A. The buried conductive region may be a buried source region of the nonvolatile memory array, and parallel to the word lines of the nonvolatile memory array. The buried conductive region may be perpendicular to the isolation region 210. FIG. 2B is a cross section view along the A–A' line in FIG. 2A. Based on FIG. 2B, the buried source region 240 is formed on the surface of the substrate 200. The buried source region 240 may be formed by ion implantation, or other well-known technologies.

Figure 1B:
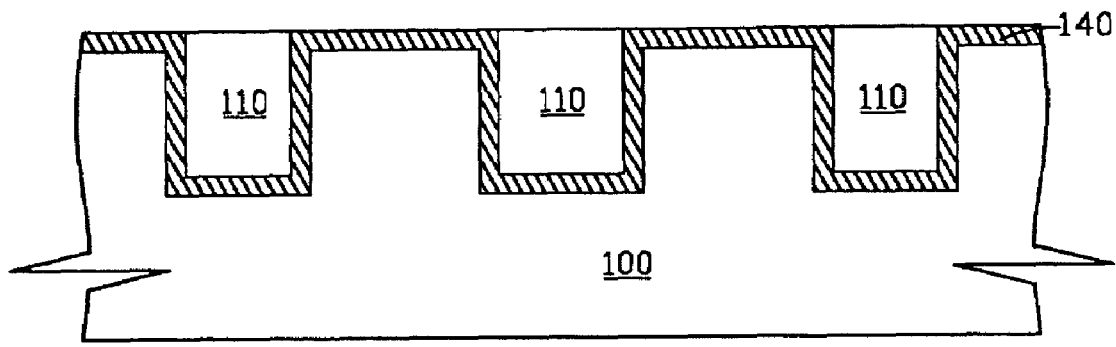
FIG. 1B is a cross section view along the line A–A' in FIG. 1A.
Figure 1C:
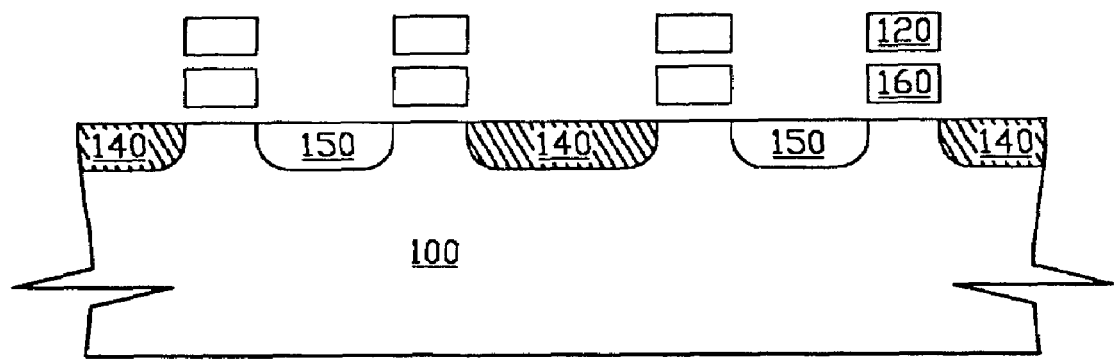
FIG. 1C is a cross section view along the line B–B' in FIG. 1A.

The depth of the buried source region 240 is smaller than the depth of the isolation region 210, wherein the depth of the buried source region means the difference between the highest level of the buried source region and the lowest level of the buried source region. As shown in FIG. 2B, there is no isolation region formed in the buried source region 240, and the topology of the high-step or low-step profile in FIG. 1B will not occurred in the buried source region 240 according to this embodiment. Therefore, comparing to the source region in the prior art, the buried source region 240 can reduce the source line sheet resistance, and the reliability of the nonvolatile memory array according to this embodiment can be improved.

Figure 2C:
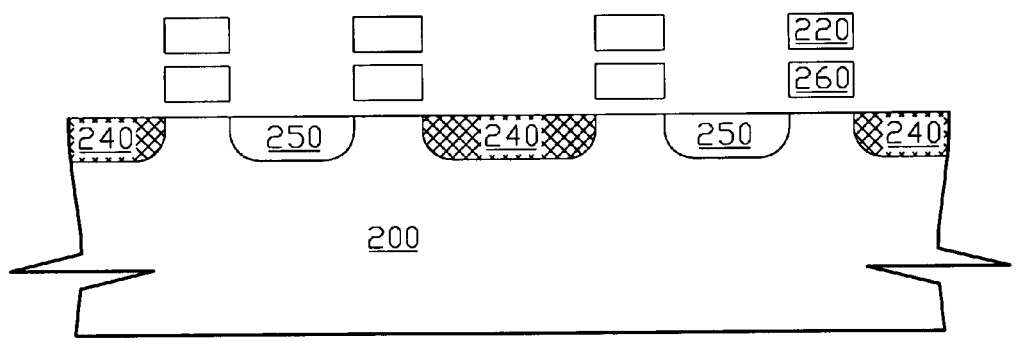
FIG. 2C is a cross section view along the line B–B' in FIG. 2A.

FIG. 2C is a cross section view alone the B–B' line in FIG. 2A. As shown in FIG. 2C, the nonvolatile memory array comprises a plurality of buried source region 240 and a plurality of drain region 250 in the substrate 200. The above-mentioned nonvolatile memory array further comprises a plurality of first ploysilicon layer 260 on the substrate 200, and a plurality of second polysilicon layer 220 respectively on the first polysilicon layers 260. The first polysilicon layers 260 and the second ploysilicon layers 220 will form the gate structures of the nonvolatile memory array.

Figure 2D:
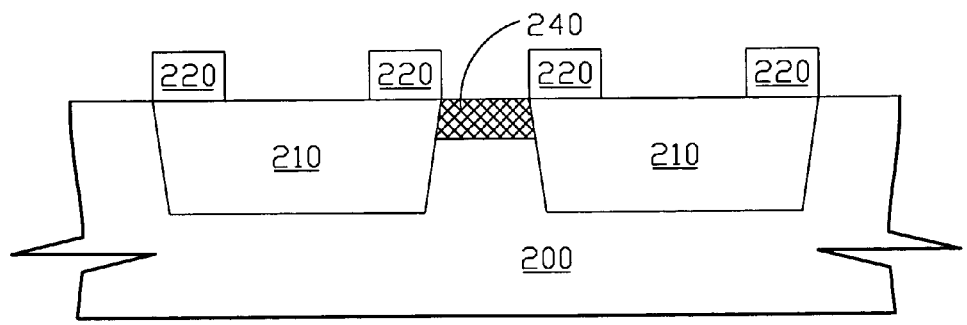
FIG. 2D is a cross section view along the line C–C' in FIG. 2A.

FIG. 2D is a cross section view alone the C–C' line in FIG. 2A. According to FIG. 2D, the nonvolatile memory array comprises a plurality of isolation region 210. The buried source region 240 is between the isolation regions 240, and the depth of the buried source region 240, the difference between the highest level and the lowest level of the buried conductive region, is less than the depth of the isolation region 210. The buried conductive region 240 is on the surface of the substrate 200, such that the buried conductive region 240 is not under the isolation regions 210. Moreover, as shown in FIG. 2D, the second polysilicon layer 220 is on the isolation region 210.

Figure 1D:
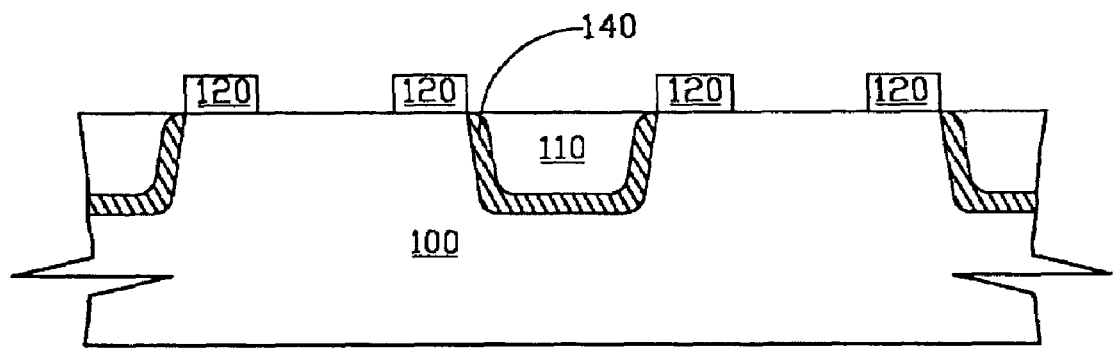
FIG. 1D is a cross section view along the line C–C' in FIG. 1A.

After comparing FIG. 2D with FIG. 1D, the difference between the nonvolatile memory array according to this embodiment and the nonvolatile memory array in the prior art is perceptible. In the prior art, because of the isolation regions in the source region, the high-step or low-step profile will be formed in the source region. Therefore, the source line sheet resistance of the nonvolatile memory array in the prior art will be raised with the topology of the high-step or the low-step profile in the source region, and the reliability and the operating performance of the nonvolatile memory array will be reduced.

On the other hand, in this embodiment, there is no isolation region in the source region, and the above-mentioned topology of the high-step or low-step profile will not be formed in the source region according to this embodiment. In other words, the source region according to this embodiment may be a conductive layer formed on the surface of the substrate, and the depth of the source region is less than the depth of the isolation region. Consequently, the source line sheet resistance of the nonvolatile memory array according to this embodiment is lower than the source line sheet resistance of the source region in the prior art. That is, the nonvolatile memory array according to this embodiment can show the better reliability and operating performance than the nonvolatile memory array in the prior art. Additionally, because there is no isolation region in the source region according to this embodiment, the manufacturing process of the nonvolatile memory array according to this embodiment can be easier than the manufacturing process of the nonvolatile memory array in the prior art.

According to the preferred embodiments, this invention discloses a structure of a nonvolatile memory array with low source line sheet resistance. The above-mentioned nonvolatile memory array comprises a substrate, a plurality of isolation region, a plurality of gate structure, and at least a buried conductive region between the isolation regions. The isolation region may be shallow trench isolation. The buried conductive region may be the source line of the nonvolatile memory array. Because there is no isolation region in the buried conductive region, the topology of the high-step or low step profile in the prior art will not occurred in the buried conductive region according to this invention. Hence, the source line sheet resistance of the above-mentioned nonvolatile memory array is lower than the source line sheet resistance of the nonvolatile memory array in the prior art. Thus, the nonvolatile memory array according to this present invention can achieve higher reliability and operating performance than the nonvolatile memory array in the prior art.

Although specific embodiments have been illustrated and described, it will be obvious to those skilled in the art that various modifications may be made without departing from what is intended, but not to be limited solely by the appended claims.

What is claimed is:

1. A structure of nonvolatile memory array, comprising:
   a substrate;
   a plurality of isolation regions in said substrate;
   a plurality of gate structures on said substrate;
   a buried source line between said plurality of isolation regions, wherein said buried source line is perpendicular to each of said plurality of isolation regions and a depth of said buried source line is less than a depth of said plurality of isolation regions, and wherein the gate structures are not positioned on said buried source line; and
   a plurality of drain regions in said substrate.

2. The structure according to claim 1, wherein each of said plurality of isolation regions is a shallow trench isolation.

3. The structure according to claim 1, wherein each said plurality of gate structures comprises at least a polysilicon layer.

4. The structure according to claim 1, further comprising a plurality of contacts in said substrate.

* * * * *